(12) United States Patent
Nakajima

(10) Patent No.: US 8,044,834 B2
(45) Date of Patent: Oct. 25, 2011

(54) TRACK-AND-HOLD CIRCUIT AND A/D CONVERTER

(75) Inventor: Yuji Nakajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/717,527

(22) Filed: Mar. 4, 2010

(65) Prior Publication Data

US 2010/0231428 A1    Sep. 16, 2010

(30) Foreign Application Priority Data

Mar. 11, 2009    (JP) .................... 2009-057601

(51) Int. Cl.
*H03M 1/00* (2006.01)
(52) U.S. Cl. ........................ 341/122; 341/155
(58) Field of Classification Search .......... 341/122, 341/155; 327/390, 97, 93, 288, 589
See application file for complete search history.

(56) References Cited

U.S. PATENT DOCUMENTS

| | | | | |
|---|---|---|---|---|
| 5,170,075 A | * | 12/1992 | de Wit | 327/93 |
| 5,721,563 A | * | 2/1998 | Memida | 345/98 |
| 6,160,508 A | * | 12/2000 | Gustavsson et al. | 341/155 |
| 6,323,697 B1 | * | 11/2001 | Pavan | 327/94 |
| 6,724,236 B1 | * | 4/2004 | Sarraj | 327/390 |
| 6,977,544 B2 | * | 12/2005 | Nicollini et al. | 327/589 |
| 7,277,130 B2 | * | 10/2007 | Korthout et al. | 348/308 |

FOREIGN PATENT DOCUMENTS

| | | |
|---|---|---|
| JP | 10-509012 | 9/1998 |
| JP | 2006-115003 | 4/2006 |

OTHER PUBLICATIONS

Venes et al., "An 80-MHz, 80-mW, 8b CMOS Folding A/D Converter with Disturbed Track-and-Hold Preprocessing", IEEE Journal of Solid-State Curcuits, Dec. 1996, vol. 31, No. 12, pp. 1846-1853.

* cited by examiner

*Primary Examiner* — Jean Jeanglaude
(74) *Attorney, Agent, or Firm* — Young & Thompson

(57) ABSTRACT

A track-and-hold circuit includes a first sampling circuit that samples an analog input signal, a second sampling circuit that samples the analog input signal, the second sampling circuit and the first sampling circuit being connected in parallel, a first amplifier that amplifies a signal output from the first sampling circuit, and a second amplifier that amplifies a signal output from the second sampling circuit.

11 Claims, 9 Drawing Sheets

US 8,044,834 B2

TRACK-AND-HOLD CIRCUIT AND A/D CONVERTER

INCORPORATION BY REFERENCE

This application is based upon and claims the benefit of priority from Japanese patent application No. 2009-057601, filed on Mar. 11, 2009, the disclosure of which is incorporated herein in its entirety by reference.

BACKGROUND

1. Field of the Invention

The present invention relates to a track-and-hold circuit and an A/D converter using the same.

2. Description of Related Art

An analog/digital (A/D) converter typically includes a track-and-hold (T/H) circuit that samples an analog signal and holds its value for a certain period. The track-and-hold (T/H) circuit is also called sample-and-hold (S/H) circuit. In this specification, the term track-and-hold (T/H) circuit is used to include both of them.

Further, most T/H circuits include a preamp to amplify an analog signal that is input to a comparator, and a sampling circuit that includes a switched capacitor. For example, Japanese Unexamined Patent Application Publication No. 2006-115003 discloses a T/H circuit that includes a sampling circuit at the previous stage of the preamp.

Further, Published Japanese Translation of PCT International Publication for Patent Application, No. 10-509012 (U.S. Pat. No. 5,886,544) discloses, in FIGS. 2 and 4, the structure of amplifying one analog signal by N preamps and sampling the analog signals that are amplified by each of the preamps by separate sampling circuits. An article written by Venes, A. G. W. et al., titled "An 80-MHz, 80-mW, 8-b CMOS Folding A/D Converter with Distributed Track-and-Hold Preprocessing" (IEEE Journal of Solid-State Circuits, December 1996, Vol. 31, No. 12, pp. 1846-1853), which is the article written by the inventor of Published Japanese Translation of PCT International Publication for Patent Application, No. 10-509012, also discloses the similar technique.

FIG. 9 is a diagram schematically showing the circuit configuration of a T/H circuit shown in FIGS. 2 and 4 of Published Japanese Translation of PCT International Publication for Patent Application, No. 10-509012. Further, FIG. 10 shows an AC equivalent circuit in FIG. 9, and is a diagram to describe the problem solved by the present invention.

As shown in FIG. 9, the T/H circuit includes n (n is a natural number) pairs of preamps A and sampling circuits SC. An analog input signal Vin is input to n preamps A101, A102, ..., A10$n$. The preamps A101, A102, ..., A10$n$ amplify the difference between the analog input signal Vin and each of reference voltages Vref1, Vref2, ..., Vrefn. Each signal that is output from the preamps A101, A102, ..., A10$n$ is sampled by sampling circuits SC101, SC102, ..., SC10$n$, respectively.

Now, description will be made on a pair of the preamp A101 and the sampling circuit SC101 as a representative example. The preamp A101 is a differential amplifier, and includes load resistors R1, R2 in each of two outputs. As shown in FIG. 9, the load resistors R1, R2 are operated as output resistors of the preamp A101. Each output of the preamp A101 is connected to a respective one of sampling capacitors C through a respective one of switches SW. The sampling circuit SC101 is formed by two pairs of switches SW and the sampling capacitors C. Other preamps and the sampling circuits have the similar structures, and therefore description will be omitted.

FIG. 10 is an AC equivalent circuit of FIG. 9. Description will now be made on the pair of the preamp A101 and the sampling circuit SC101 as a representative example. As shown in FIG. 10, an analog input signal Vin1 is input to this pair, and an analog output signal Vout1 is output. Now, Vin1=Vin−Vref1. A transfer function H(s)=Vout1/Vin1 can be expressed by the following equation (1) using transconductance gm, output impedance Rout based on the load resistors R1, R2, ON resistance Rsw of the switch SW, and capacitance Csamp of the sampling capacitor C.

$$H(s) = -gm \cdot \text{Rout}/\{s \cdot Csamp \cdot (Rsw + \text{Rout}) + 1\} \quad (1)$$

A time constant τ of the output response can be expressed by the following equation (2) from the equation (1).

$$\tau = Csamp \cdot (Rsw + \text{Rout}) \quad (2)$$

The equation (2) is established in any pair of the preamp A and the sampling circuit SC. However, as there are n pairs of the preamps A and the sampling circuits SC, variation Δτ of the time constant τ needs to be considered. When the variation of the ON resistance Rsw of the switch SW is indicated by ΔRsw, the variation of the output impedance Rout by ΔRout, the variation of the capacitance Csamp of the sampling capacitor C by ΔCsamp, the following equation (3) is established based on the equation (2).

$$\tau + \Delta\tau = (Csamp + \Delta Csamp) \cdot (Rsw + \text{Rout} + \Delta Rsw + \Delta \text{Rout}) \quad (3)$$

The accuracy of the output voltage is degraded as the variation Δτ of the time constant is increased.

SUMMARY

A exemplary aspect of the present invention is a track-and-hold circuit including a first sampling circuit that samples an analog input signal, a second sampling circuit that samples the analog input signal, the second sampling circuit and the first sampling circuit being connected in parallel, a first amplifier that amplifies a signal output from the first sampling circuit, and a second amplifier that amplifies a signal output from the second sampling circuit.

According to the track-and-hold circuit of the present invention, the first and the second sampling circuits are provided at the previous stages of the first and the second amplifiers, whereby it is possible to eliminate the influence of the output impedance of the amplifier in variations of the time constant, and to provide a track-and-hold circuit with high speed and high accuracy.

According to the present invention, it is possible to provide a track-and-hold circuit with high speed and high accuracy.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a diagram schematically showing a case in which both of a switch SW of the sampling circuit SC1 and a reset switch RS of the preamp A1 are ON;

DETAILED DESCRIPTION OF THE EXEMPLARY EMBODIMENTS

Hereinafter, the specific exemplary embodiments to which the present invention is applied will be described in detail with reference to the drawings. It should be noted that the present invention is not limited to the following exemplary embodiments. Further, the following description and the drawings are simplified as appropriate for the sake of clarity.

First Exemplary Embodiment

Figure 1:
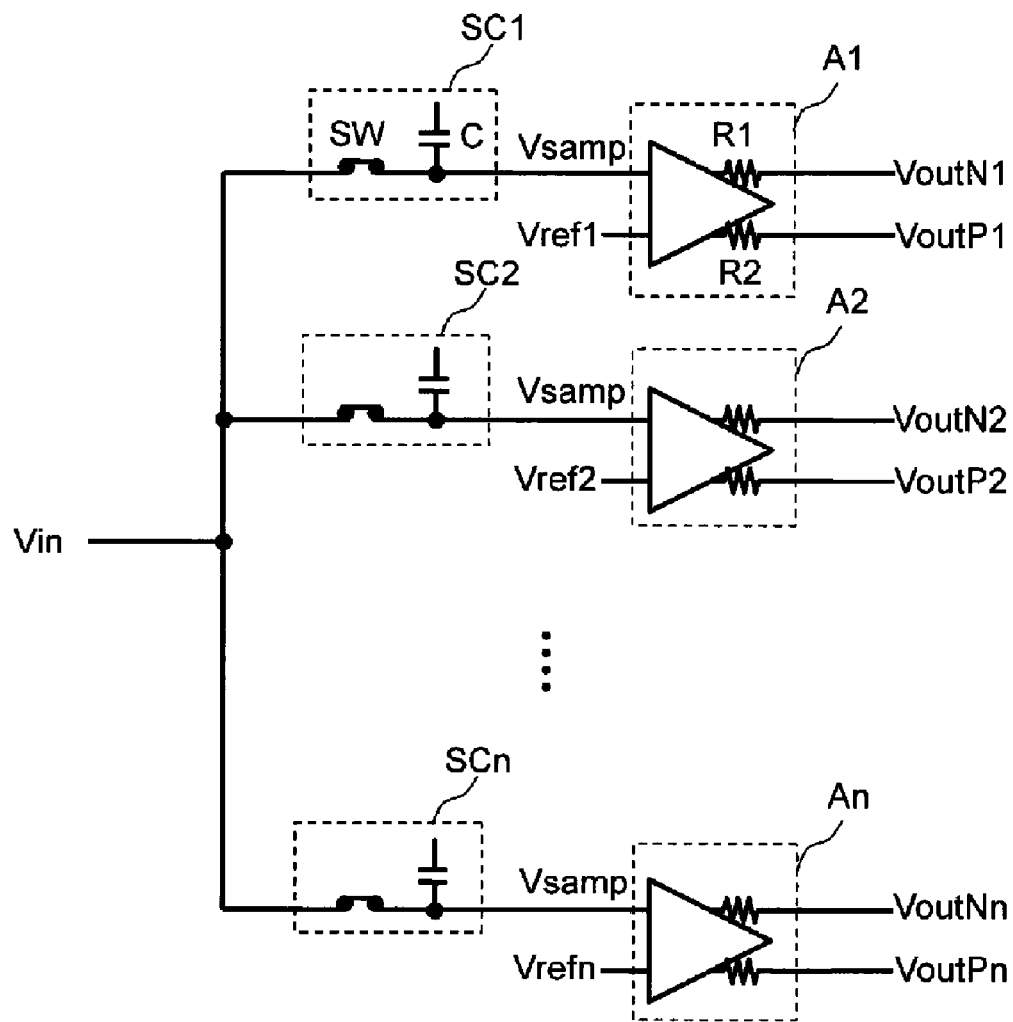
FIG. 1 is a circuit diagram of a T/H circuit according to a first exemplary embodiment.

FIG. 1 is a circuit diagram of a track-and-hold (T/H) circuit according to the first exemplary embodiment of the present invention. This T/H circuit is suitable for an analog/digital (A/D) converter. This T/H circuit includes n pairs of sampling circuits SC and preamps A. An analog input signal Vin is input to n sampling circuits SC1, SC2, ..., SCn and is sampled. Sampling signals Vsamp that are output from the sampling circuits SC1, SC2, ..., SCn are input to the preamps A1, A2, ..., An. The preamps A1, A2, ..., An amplify the difference between the sampling signals Vsamp and each of the reference voltages Vref1, Vref2, ..., Vrefn, and output differential output signals VoutP1, VoutN1, VoutP2, VoutN2, ..., VoutPn, VoutNn.

Now, a pair of the sampling circuit SC1 and the preamp A1 will be described as a representative example. The sampling circuit SC1 includes a pair of switch SW and sampling capacitor C. The analog input signal Vin is sampled by the sampling capacitor C through the switch SW. While two switches SW and two sampling capacitors C are required for one preamp in a T/H circuit shown in FIG. 9, only one switch SW and one sampling capacitor C are required for one preamp in the T/H circuit shown in FIG. 1.

The preamp A1 is a differential amplifier, and has one input to which the sampling signal Vsamp output from the sampling circuit SC1 is input and the other input to which the reference voltage Vref1 is input. Further, the preamp A1 includes load resistors R1, R2 in each of two outputs. As shown in FIG. 1, the load resistors R1, R2 function as output resistors of the preamp A1. The preamp A1 outputs output signals VoutN1, VoutP1.

Figure 2:
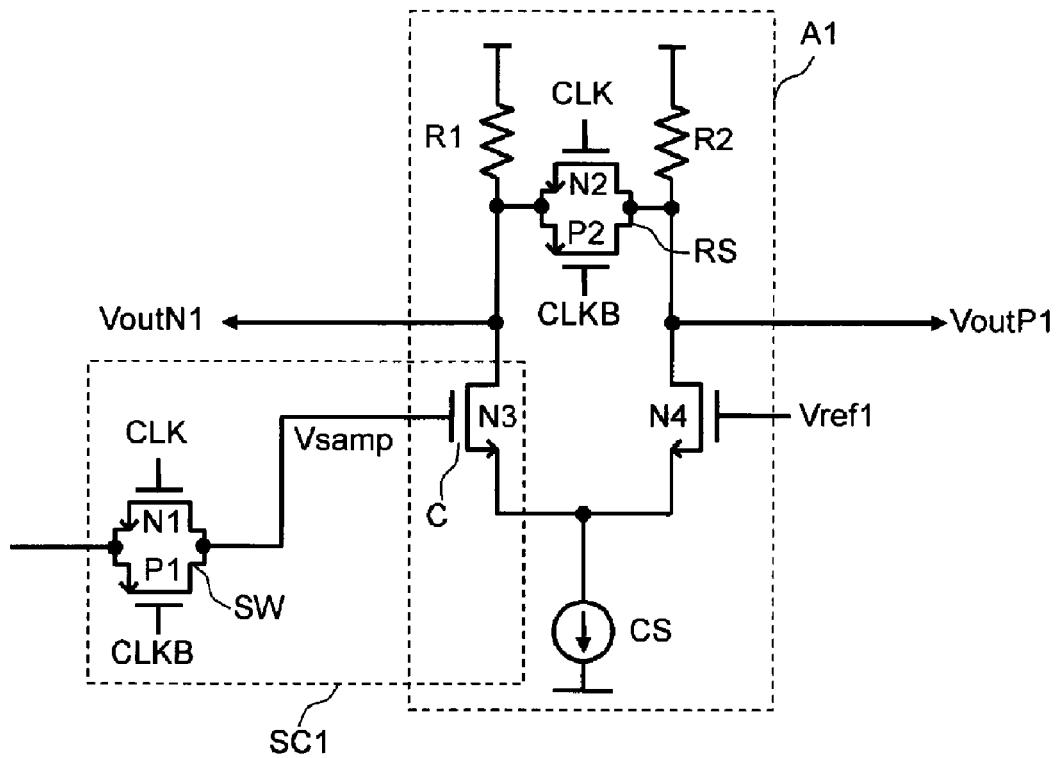
FIG. 2 is a circuit diagram of a sampling circuit SC1 and a preamp A1.

FIG. 2 is a circuit diagram of the sampling circuit SC1 and the preamp A1. The sampling circuit SC1 includes the sampling capacitor C and the switch SW as stated above. The switch SW is formed by an NMOS transistor N1 and a PMOS transistor P1 that are connected in parallel. Further, the gate capacitor of an input transistor N3 of the preamp A1 is used as the sampling capacitor C.

A clock signal CLK is input to a gate of the NMOS transistor N1, and an inverting clock signal CLKB is input to a gate of the PMOS transistor P1. In a period of the clock signal CLK=H (High), both of the NMOS transistor N1 and the PMOS transistor P1 are ON, which means a sampling period. Meanwhile, in a period of the clock signal CLK=L (Low), both of the NMOS transistor N1 and the PMOS transistor P1 are OFF, which means a hold period.

As shown in FIG. 2, the preamp A1 includes two input transistors N3, N4, a constant current source CS, a reset switch RS, and two load resistors R1, R2. One end of each of the load resistors R1, R2 is connected to a power supply (power supply voltage VDD). The other end of each of the load resistors R1, R2 is connected to drains of the input transistors N3, N4, respectively. Both of the input transistors N3, N4 are NMOS transistors. The output signal VoutN1 is output from a node (output node) between the load resistor R1 and the drain of the input transistor N3, and the output signal VoutP1 is output from a node (output node) between the load resistor R2 and the drain of the input transistor N4.

Sources of the input transistors N3, N4 are connected to one terminal of the constant current source CS. To a gate of the input transistor N3, the sampling signal Vsamp output from the sampling circuit SC1 is input. To a gate of the input transistor N4, the reference voltage Vref1 is supplied. The other terminal of the constant current source CS is connected to the ground. Although the reference voltage is applied to the gate of the input transistor N4 in the first exemplary embodiment, it is not limited to this example.

Further, a reset switch RS is provided between the two output nodes. The reset switch RS is formed by an NMOS transistor N2 and a PMOS transistor P2 that are connected in parallel, as is similar to the switch SW of the sampling circuit SC1.

A clock signal CLK is input to a gate of the NMOS transistor N2, and an inverting clock signal CLKB is input to a gate of the PMOS transistor P2. In short, the reset switch RS and the switch SW of the sampling circuit SC1 are synchronized with each other.

In the period of the clock signal CLK=H (High), both of the NMOS transistor N2 and the PMOS transistor P2 are ON, which means a reset period. In the reset period, two output nodes are in conduction states, and the voltages are equal to each other. On the other hand, in the period of the clock signal CLK=L (Low), both of the NMOS transistor N2 and the PMOS transistor P2 are OFF, which means an amplification period.

Hence, the preamp A1 performs resetting while the sampling circuit SC1 performs sampling, and the preamp A1 performs amplification while the sampling circuit SC1 performs holding.

Figure 3:
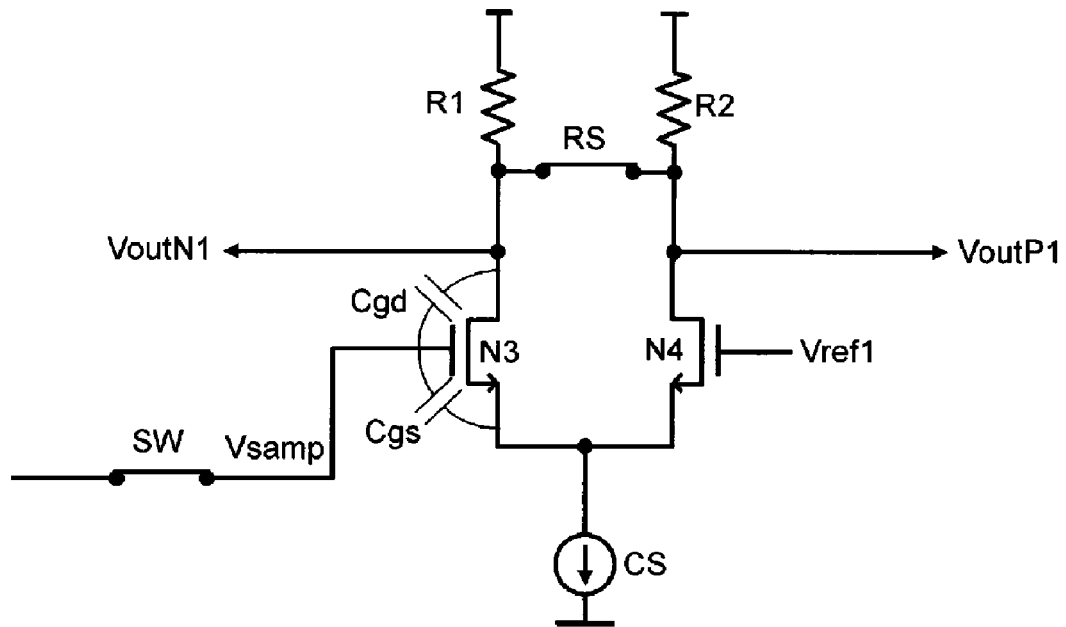

FIG. 3 schematically shows a case in which the reset switch RS of the preamp A1 and the switch SW of the sampling circuit SC1 are both ON. During this period, the sampling circuit SC1 performs sampling and the preamp A1 performs reset. Now, a gate-drain capacitance of the input transistor N3 is indicated by Cgd, and a gate-source capacitance is indicated by Cgs. As stated above, as the preamp A1 performs reset operation, the drain voltages of the input transistors N3, N4 are equal with each other regardless of the operation state in the previous cycle. The amplification operation is always started from this state, whereby it is possible to realize amplifying operation with high accuracy.

Figure 4:
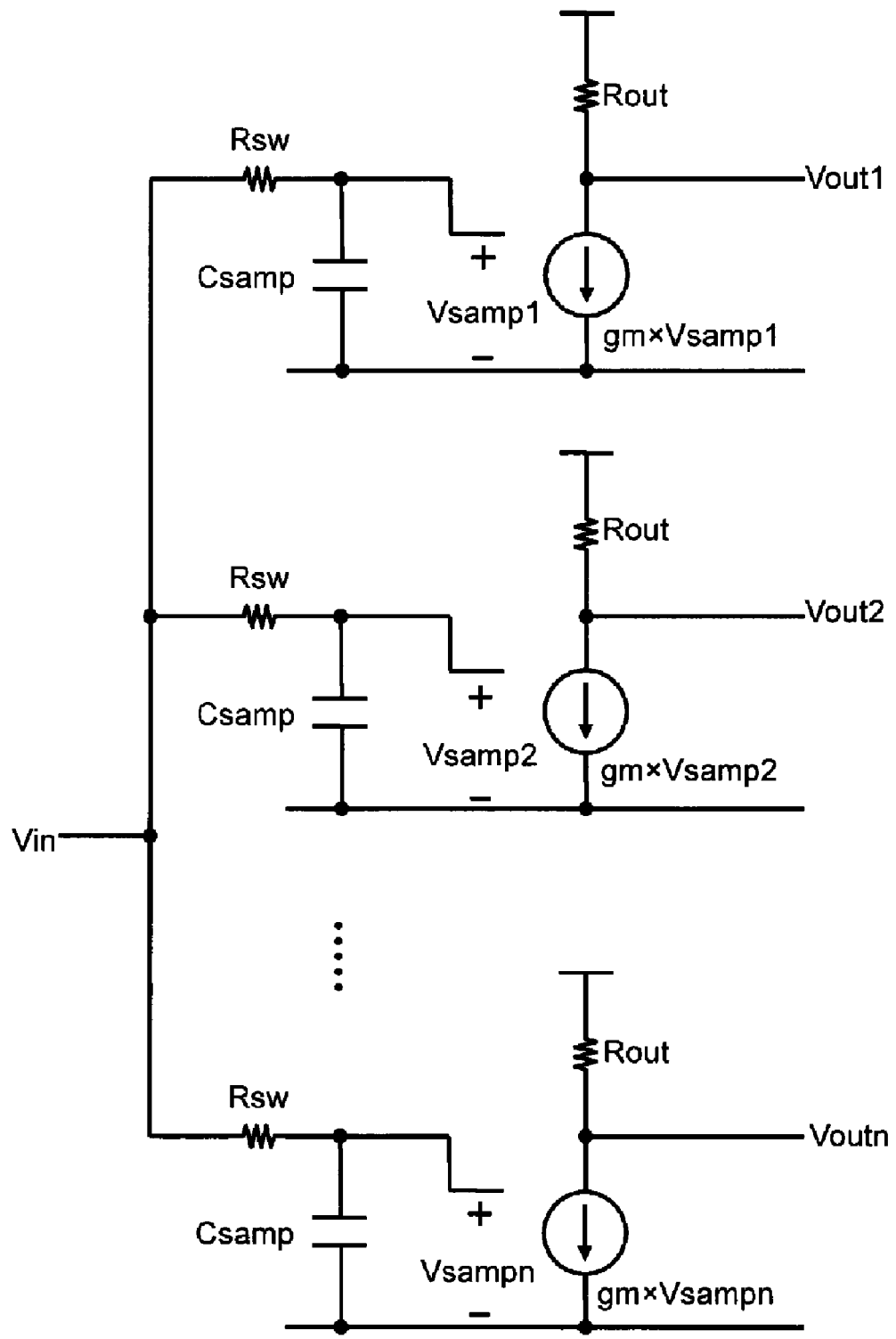
FIG. 4 is an AC equivalent circuit in FIG. 1.

FIG. 4 is an AC equivalent circuit of FIG. 1. A pair of the sampling circuit SC1 and the preamp A1 will be described as a representative example. As shown in FIG. 4, the analog input signal Vin1 (=Vin−Vref1) is input to this pair. The sampling signal Vsamp1 (=Vsamp−Vref1) based on the analog input signal Vin1 is amplified and the analog output signal Vout1 is output. Then, a transfer function H(s)=Vout1/Vin1 can be expressed by the following equation (4) using transconductance gm, output impedance Rout based on the load resistors R1, R2, ON resistance Rsw of the switch SW, and capacitance Csamp of the sampling capacitor C.

$$H(s) = -gm \cdot Rout/(s \cdot Csamp \cdot Rsw + 1) \qquad (4)$$

A time constant τ of the output response can be expressed by the following equation (5) from the equation (4).

$$\tau = Csamp \cdot Rsw \qquad (5)$$

As shown in the equation (5), in the first exemplary embodiment, the time constant τ is not influenced by the output impedance Rout of the preamp. For example, when each circuit constant satisfies gm=200 μS, Rout=16 kΩ, Rsw=2 kΩ, Csamp=10 fF, the time constant of the response is 20 psec. Now, the time constant is sufficiently small for the operation at high speed such as 2 GHz, and thus the error of the output voltage can be made sufficiently small.

Figure 9:
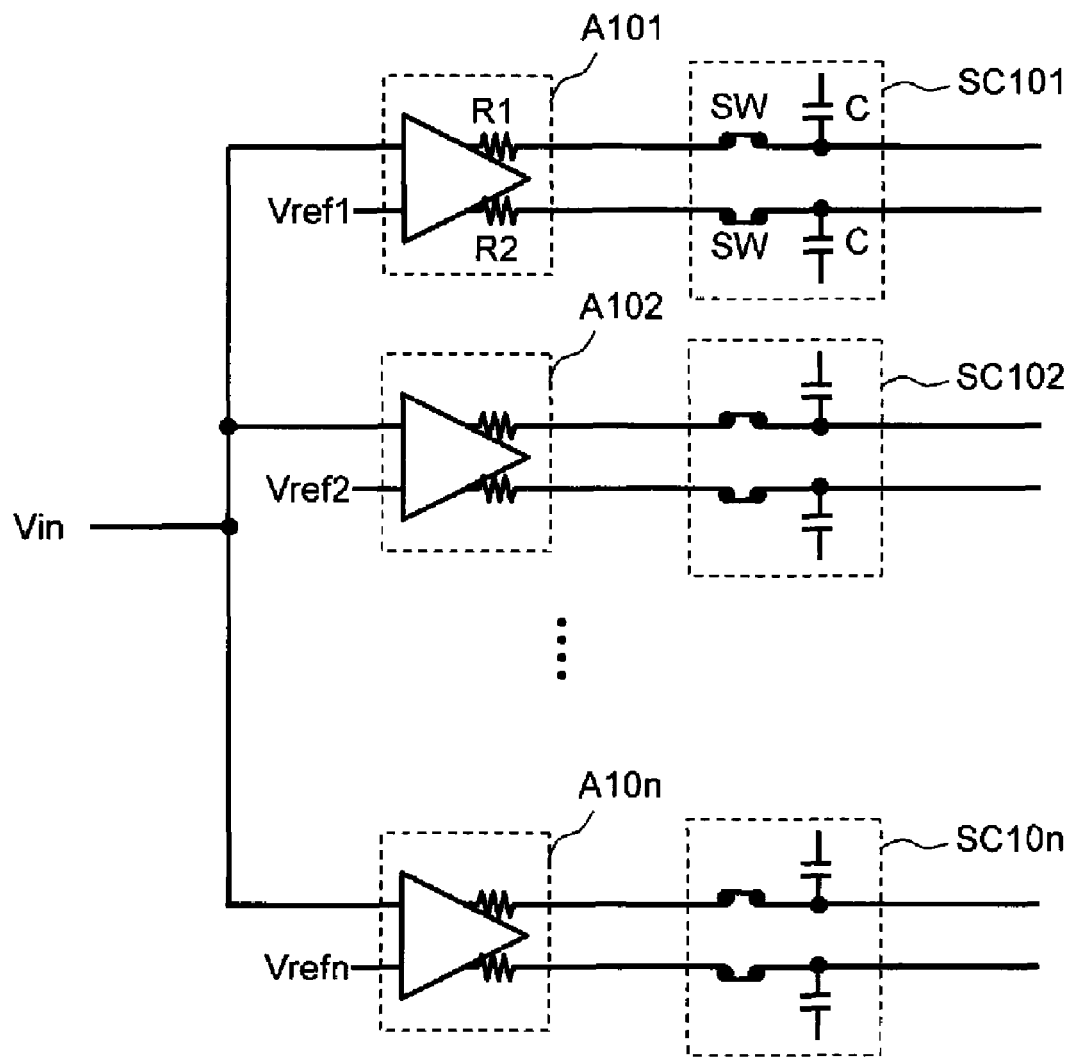
FIG. 9 is a diagram schematically showing the circuit configuration of a T/H circuit shown in FIGS. 2 and 4 of Published Japanese Translation of PCT International Publication for Patent Application, No. 10-509012.
Figure 10:
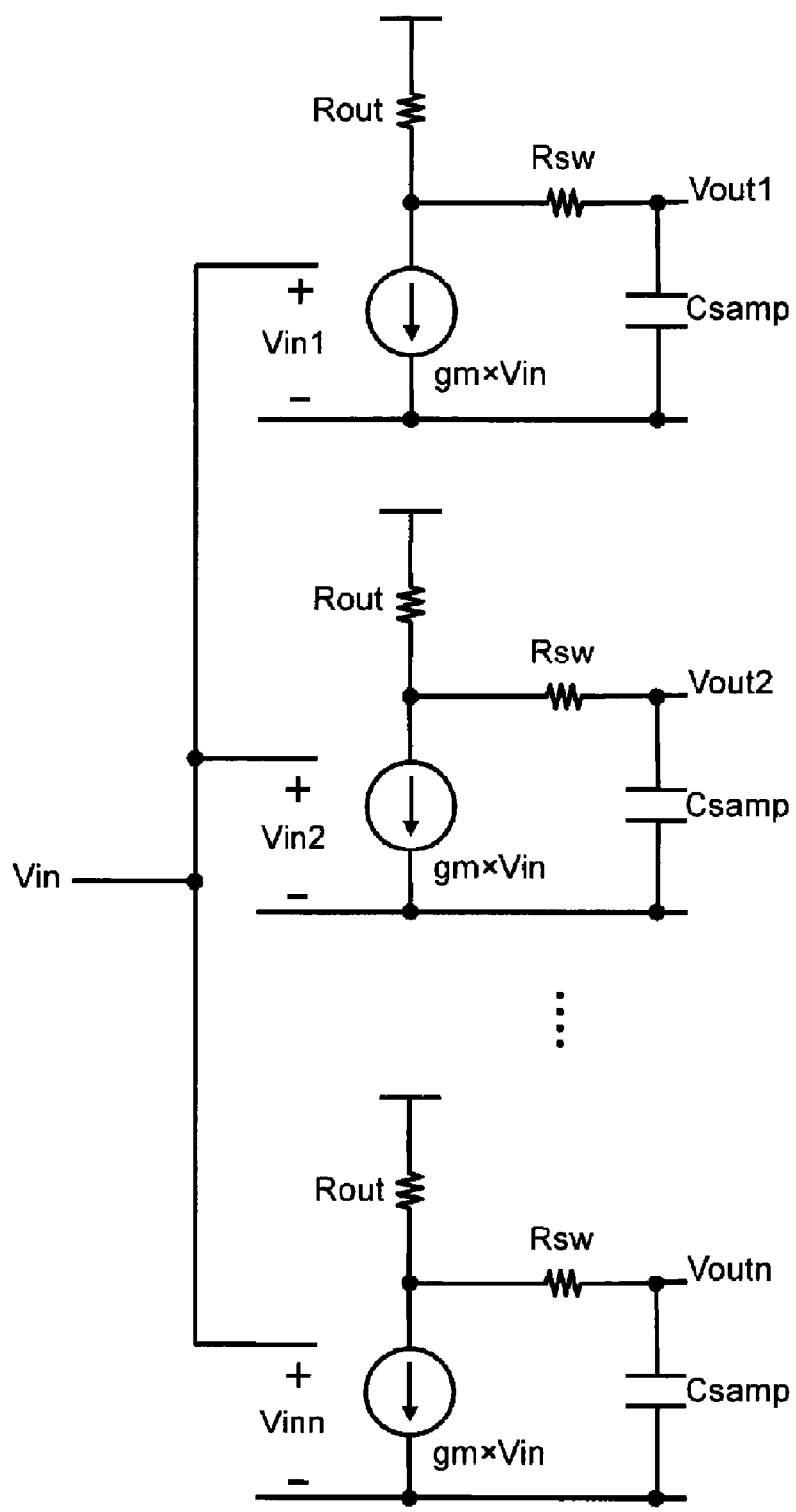
FIG. 10 shows an AC equivalent circuit shown in FIG. 9, and describes the problem solved by the present invention.

On the other hand, in case of the circuit configuration shown in FIGS. 9 and 10, the value of the output impedance Rout cannot be reduced in order to secure the gain of the preamp A101. For example, when each circuit constant is equal to each other, the time constant τ is 0.18 nsec from the equation (1). This time constant τ is not sufficiently small with respect to the cycle of the clock for the operation at high speed such as 2 GHz, for example, and the accuracy of the output voltage is degraded.

Further, the equation (5) is established in any pair of the preamp A and the sampling circuit SC. As there are n pairs of the preamps A and the sampling circuits SC, the variation Δτ of the time constant τ needs to be considered. When the variation of the ON resistance Rsw of the switch SW is indicated by ΔRsw and the variation of the capacitance Csamp of the sampling capacitor C is indicated by ΔCsamp, the following equation (6) is established based on the equation (5).

$$\tau + \Delta\tau = (Csamp - \Delta Csamp) \cdot (Rsw + \Delta Rsw) \qquad (6)$$

As will be understood from the equation (6), in the first exemplary embodiment, the variation Δτ of the time constant is not influenced by the variation ΔRout of the output impedance of the preamp. Now, if it is assumed in the above example that ΔCsamp and ΔRsw are 10% of each of Csamp, Rsw, Δτ=4.2 psec. It is preferable that Δτ≦10 psec in the high-speed operation such as 2 GHz, for example. As the variation is sufficiently small, the accuracy of the output voltage is not degraded.

On the other hand, with the circuit configuration shown in FIGS. 9 and 10, if it is assumed that ΔCsamp, ΔRsw, ΔRout are 10% of each of Csamp, Rsw, Rout, ΔT=37.8 psec from the equation (3). Thus, the accuracy of the output voltage is degraded.

Figure 5:
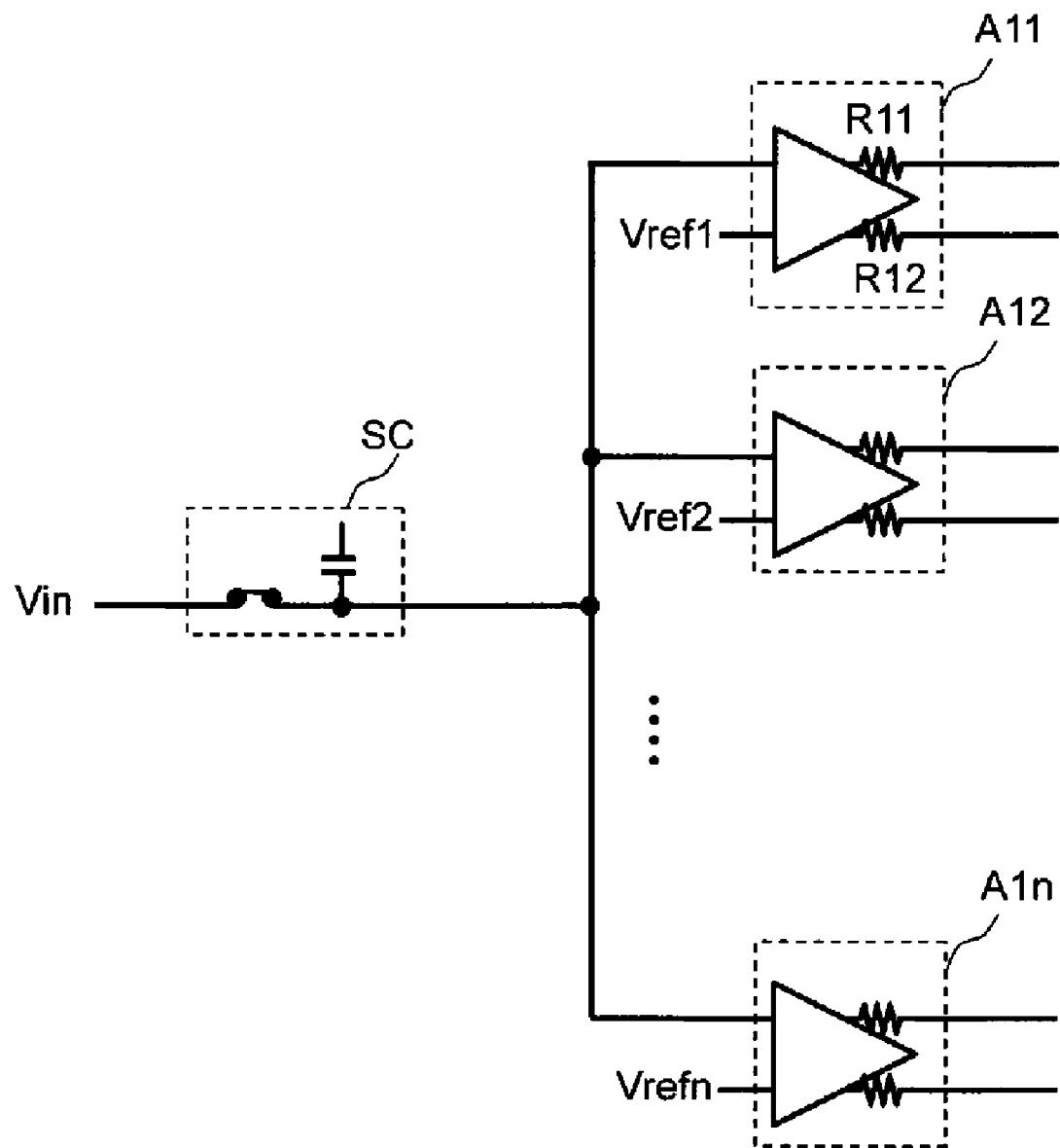
FIG. 5 is a circuit diagram of a T/H circuit according to a comparative example.

FIG. 5 is a circuit diagram of a T/H circuit according to a comparative example. The T/H circuit shown in FIG. 1 is of distributed type in which the sampling circuits SC1, SC2, . . . , SCn are arranged at the previous stage of each of the preamps A1, A2, . . . , An. Meanwhile, the T/H circuit shown in FIG. 5 is of centralized type in which a unique sampling circuit SC is arranged at the previous stage of the preamps A11, A12, . . . , A1n.

Figure 6:
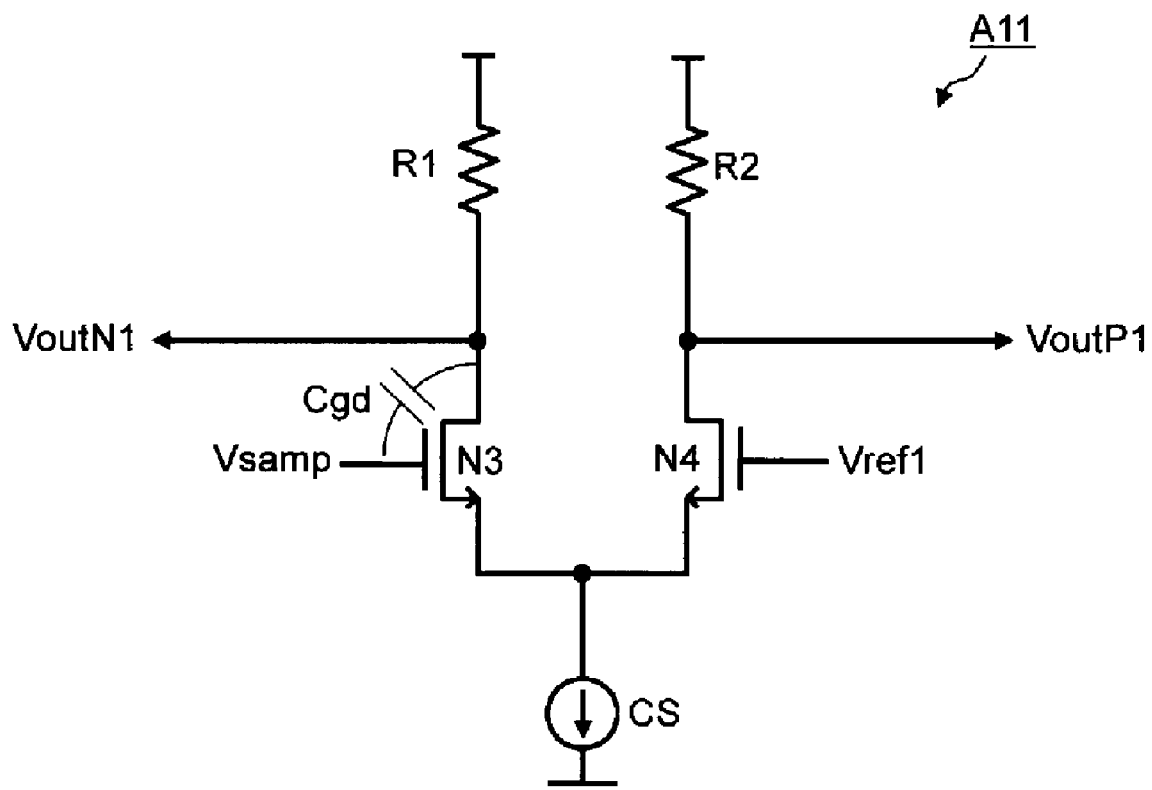
FIG. 6 is a circuit diagram of a preamp A11 according to the comparative example.

Further, FIG. 6 is a circuit diagram of the preamp A11 according to the comparative example. While the preamp A1 shown in FIG. 2 according to the first exemplary embodiment includes the reset switch RS, the preamp A11 shown in FIG. 6 according to the comparative example does not include the reset switch RS. Other structures are similar between the T/H circuit according to the first exemplary embodiment and the T/H circuit of the comparative example, and thus description will be omitted.

In the amplification period of the preamp A11, the signal is fed back to the gate in the input side through the gate-drain capacitance Cgd of the input transistor N3. In other words, the phenomenon that the signal is fed back to the node to which the sampling capacitor C is connected, which is called kick back, is occurred. In the comparative example, a plurality of preamps A1, A12, . . . , A1n are operated at the same time for one sampling circuit SC. Hence, the influence caused by a plurality of kick backs is superimposed on the sampling node, which degrades the accuracy of the sampling signal.

On the other hand, the T/H circuit according to the first exemplary embodiment is of distributed type in which the sampling circuits SC1, SC2, . . . , SCn are provided at the previous stage of each of the preamps A1, A2, . . . , An. Thus, the influence caused by the plurality of kick backs is not superimposed on the sampling node, and the accuracy of the sampling signal is not degraded.

Further, the preamps A11, A12, . . . , A1n of the T/H circuit according to the comparative example do not include the reset switch RS. Thus, the drain voltages of the input transistors N3, N4 are influenced by the operation state in the previous cycle, and thus it is impossible to realize amplifying operation with high accuracy. On the other hand, the preamps A1, A2, . . . , An of the T/H circuit according to the first exemplary embodiment include the reset switch RS. Thus, the drain voltages of the input transistors N3, N4 are not influenced by the operation state in the previous cycle, whereby amplifying operation can be realized with high accuracy. The first exemplary embodiment is particularly suitable when the high-speed operation of the clock frequency of 2 GHz or more is required.

Second Exemplary Embodiment

Figure 7:
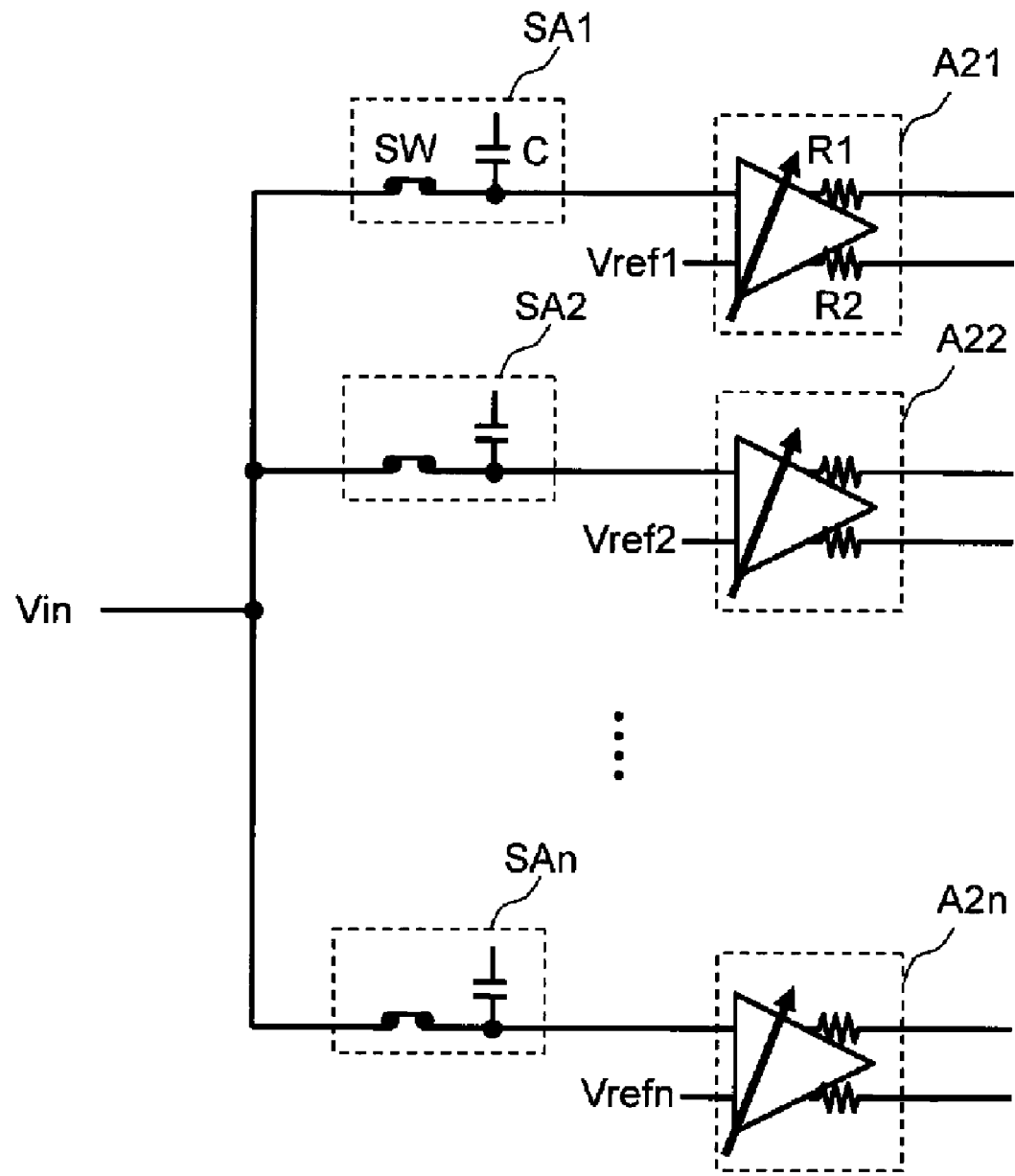
FIG. 7 is a circuit diagram of a T/H circuit according to a second exemplary embodiment.

Referring now to FIG. 7, the second exemplary embodiment of the present invention will be described. FIG. 7 is a circuit diagram of a T/H circuit according to the second exemplary embodiment. The T/H circuit shown in FIG. 7 is different from that shown in FIG. 1 in that preamps A21, A22, . . . , A2n are of variable type.

Figure 8:
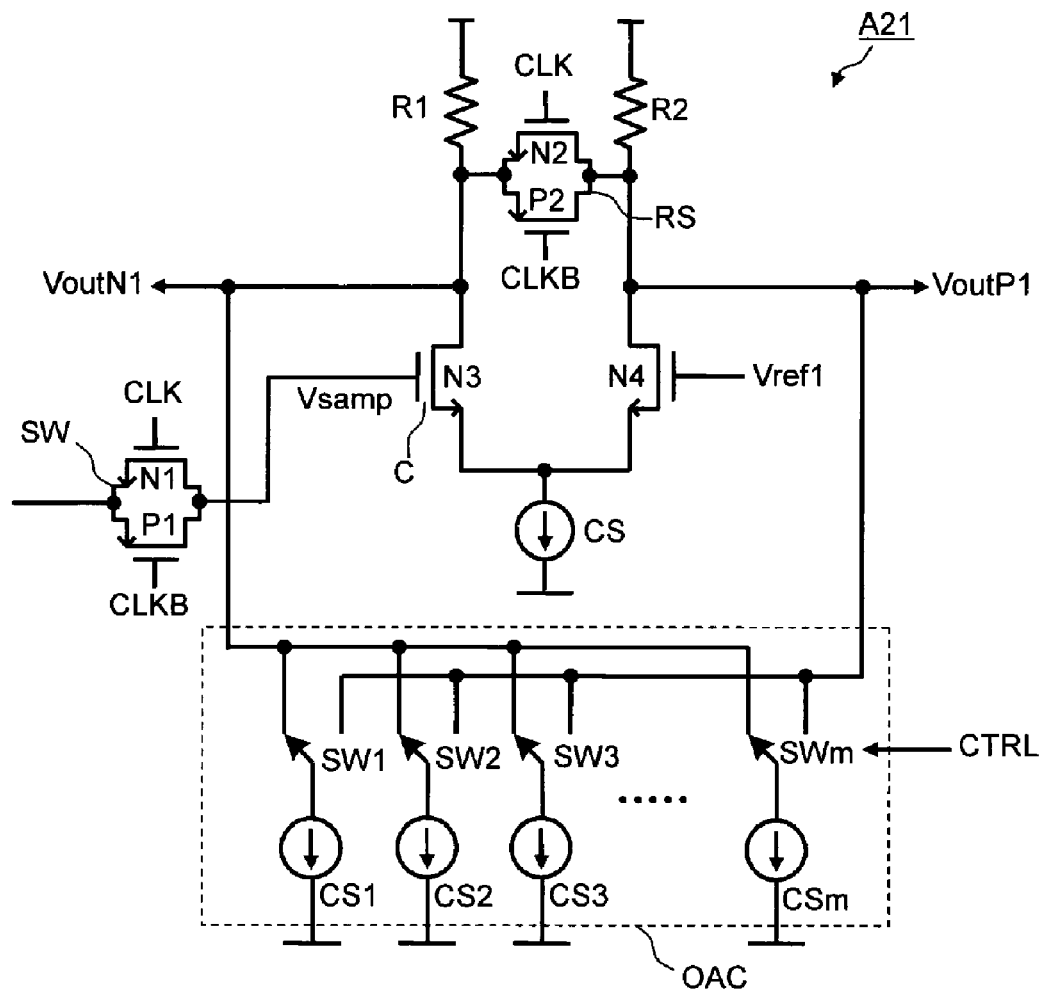
FIG. 8 is a circuit diagram of a preamp A21 according to the second exemplary embodiment.

FIG. 8 is a circuit diagram of the preamp A21 according to the second exemplary embodiment. An offset adjustment circuit OAC is added between two output nodes. Other structures are similar to those in the first exemplary embodiment, and thus description will be omitted.

As shown in FIG. 8, one example of the offset adjustment circuit OAC includes a current-cell type (current steering) D/A converter (Digital to Analog Converter) controlled by a control signal CTRL. The offset adjustment circuit OAC shown in FIG. 8 includes a plurality of constant current sources CS1, CS2, CS3, . . . , CSm (m is a natural number), and switches SW1, SW2, SW3, . . . , SWm. Each of the constant current sources CS1, CS2, CS3, . . . , CSm is connected to either one of the two output nodes through the switches SW1, SW2, SW3, . . . , SWm, respectively. The switches SW1, SW2, SW3, . . . , SWm are switched by the control signal CTRL, and the offset amount is adjusted.

For example, by adjusting the offset amount before shipping, the manufacturing variation of the transistor elements can be cancelled. As a result, smaller transistor elements can be used for the preamps A21, A22, . . . , A2n, and high-speed operation and low power consumption are realized. Further, the influence of the charge injection of the T/H circuit can be cancelled by the offset adjustment circuit OAC. It would be appreciated from the above description that the accuracy can be enhanced in the second exemplary embodiment compared with the first exemplary embodiment.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A track-and-hold circuit comprising:
    a first sampling circuit that samples an analog input signal;
    a second sampling circuit that samples the analog input signal, the second sampling circuit and the first sampling circuit being connected in parallel;
    a first differential amplifier that amplifies a signal output from the first sampling circuit; and
    a second differential amplifier that amplifies a signal output from the second sampling circuit,
    wherein each of said first and second differential amplifiers comprise first and second output nodes and a reset switch provided between the first and the second output nodes.

2. The track-and-hold circuit according to claim 1, wherein each of the first and the second sampling circuits comprises:
    a sampling switch that supplies the analog input signal; and
    a sampling capacitor that samples and holds the analog input signal input through the sampling switch.

3. The track-and-hold circuit according to claim 2, wherein the first and the second amplifiers are differential amplifiers that each comprises first and second input transistors, and the sampling capacitor is a gate capacitor of the first input transistor.

4. The track-and-hold circuit according to claim 3, wherein a certain reference voltage is applied to a control electrode of the second input transistor.

5. The track-and-hold circuit according to claim 2,
    wherein the sampling capacitor of the first sampling circuit forms a gate capacitor of the first differential amplifier, and
    wherein the sampling capacitor of the second sampling circuit forms a gate capacitor of the second differential amplifier.

6. The track-and-hold circuit according to claim 1,
    wherein each of the first and the second sampling circuits comprises a sampling switch that supplies the analog input signal, an ON/OFF of the sampling switching being synchronized with an ON/OFF of the reset switch.

7. The track-and-hold circuit according to claim 6, wherein the sampling switch is ON while the reset switch is ON, and the sampling switch is OFF while the reset switch is OFF.

8. The track-and-hold circuit according to claim 1, wherein an offset adjustment circuit is provided between the first and the second output nodes.

9. The track-and-hold circuit according to claim 8, wherein the offset adjustment circuit is a current-cell type D/A converter.

10. The track-and-hold circuit according to claim 1, wherein the track-and-hold circuit is operated when clock frequency is 2 GHz or more.

11. An A/D converter that comprises the track-and-hold circuit according to claim 1.

* * * * *